(12) United States Patent
Cho et al.

(10) Patent No.: US 7,988,755 B2
(45) Date of Patent: Aug. 2, 2011

(54) BYPRODUCT COLLECTING APPARATUS OF SEMICONDUCTOR APPARATUS

(75) Inventors: Che-Hoo Cho, Gyeonggi-do (KR);
Jung-Eui Hong, Gyeonggi-do (KR);
Tae-Woo Kim, Gyeonggi-do (KR);
In-Mun Hwang, Gyeonggi-do (KR)

(73) Assignee: Milaebo Co., Ltd., Hwaseong-Shi (KR)

( * ) Notice: Subject to any disclaimer, the term of this patent is extended or adjusted under 35 U.S.C. 154(b) by 244 days.

(21) Appl. No.: 12/226,994

(22) PCT Filed: Apr. 25, 2007

(86) PCT No.: PCT/KR2007/002008
§ 371 (c)(1),
(2), (4) Date: Nov. 4, 2008

(87) PCT Pub. No.: WO2007/129820
PCT Pub. Date: Nov. 15, 2007

(65) Prior Publication Data
US 2009/0107091 A1    Apr. 30, 2009

(30) Foreign Application Priority Data

May 4, 2006  (KR) ........................ 10-2006-0040700
May 9, 2006  (KR) ........................ 10-2006-0041531

(51) Int. Cl.
*B01D 50/00*    (2006.01)

(52) U.S. Cl. .......... 55/385.2; 55/434.2; 55/444; 55/456; 55/457; 55/DIG. 15; 62/55.5

(58) Field of Classification Search ................. 55/385.2, 55/434.2, 440, 444, 456, 457, DIG. 13; 62/55.5
See application file for complete search history.

(56) References Cited

FOREIGN PATENT DOCUMENTS

| JP | 54053674 A | * | 4/1979 |
|---|---|---|---|
| JP | 1996-24503 | | 1/1996 |
| JP | 09-225230 A | | 9/1997 |
| KR | 10-2003-0017738 | | 3/2003 |
| TW | 363205 | | 7/1999 |

OTHER PUBLICATIONS

International Search Report and Written Opinion for PCT/KR2007/002008 dated Aug. 9, 2007.

* cited by examiner

*Primary Examiner* — Robert A Hopkins
(74) *Attorney, Agent, or Firm* — Jenkins, Wilson, Taylor & Hunt P.A.

(57) ABSTRACT

Provided is a byproduct collecting apparatus for efficiently collecting reaction-byproducts contained in an exhaust gas exhausted from a process chamber during a semiconductor manufacturing process. The apparatus includes a housing and a trap module. The housing has a gas inlet port and a gas outlet port. The trap module is installed inside the housing and has first plates curved or inclined to guide an exhaust gas flow in a curved fashion.

30 Claims, 13 Drawing Sheets

150a

158

152

BYPRODUCT COLLECTING APPARATUS OF SEMICONDUCTOR APPARATUS

TECHNICAL FIELD

The present invention relates to a byproduct collecting apparatus for efficiently collecting reaction-byproducts contained in an exhaust gas discharged from a process chamber during a semiconductor manufacturing process.

BACKGROUND ART

Generally, a semiconductor manufacturing process is classified into a pre-process (fabrication-process) and a post-process (assembly process). The pre-process means process for manufacturing a semiconductor chip by forming predetermined patterns through repeated processes of depositing a thin film on a wafer within a variety of process chambers, and selectively etching the deposited thin film. The post-process means process for assembling a completed product by separating the chips manufactured in the pre-process into individual chips, and coupling the separated chips to lead frames. At this point, the process of depositing a thin film on the wafer or etching the thin film deposited on the wafer is performed within the process chamber at high temperature using toxic gases such as silane, arsine, and boron trichloride, and a process gas such as hydrogen. During the pre-process, a large amount of various combustible gases, corrosive foreign substances, and a toxic gas containing a toxic component is generated inside the process chamber.

Therefore, a semiconductor manufacturing equipment includes a scrubber at a rear end of a vacuum pump for generating a vacuum state in the process chamber. The scrubber purifies an exhaust gas discharged from the process chamber and discharges the purified exhaust gas to atmosphere. However, when an exhaust gas discharged from the process chamber contacts the atmosphere or a surrounding temperature is low, the exhaust gas solidifies and changes into powder. The powder sticks on an exhaust line to increase an exhaust pressure, and simultaneously, causes a disorder of the vacuum pump when it is introduced to the vacuum pump, and causes a back flow of an exhaust gas to contaminate a wafer located inside a process chamber.

To solve this problem, a powder trap unit for changing an exhaust gas discharged from a process chamber 1 into a powder state is installed between the process chamber 1 and a vacuum pump 2 as illustrated in FIG. 14. That is, as illustrated in FIG. 14, the process chamber 1 is connected with the vacuum pump 3 via a pumping line 5. A trap pipe 7 for trapping and piling reaction-byproduct generated at the process chamber 1 in the form of powder branches from the pumping line 5.

In a conventional powder trap unit, a non-reacted gas generated while a thin film is deposited or etched within the process chamber 1 flows to the pumping line 5 having a relatively low temperature atmosphere compared to that of the process chamber 1, so that the non-reacted gas solidifies into powder 9, and is accumulated in the trap pipe 7 branching from the pumping line 5.

However, the above-described conventional powder trap unit has the following problems.

First, since it takes a long time until reaction-byproducts generated within the process chamber change into powder and are accumulated in the trap pipe, a turn around time (TAT) is lengthened as much as that. That is, a next thin film deposition or etching process is not performed until reaction-byproducts generated when a thin film is deposited or etched swiftly changes into powder and are accumulated in the trap pipe, but it takes a long time for the reaction-byproducts to change into powder. Accordingly, the process chamber cannot perform a next process until all of to the reaction-byproducts are removed and stands by for a long time. Therefore, not only an operating rate of an equipment reduces, but also a TAT is lengthened due to a long standby time of the process chamber. Second, since a collecting area (space) of a trap pipe in which powder is accumulated is very narrow, there has been inconvenience of having to frequently removing powder accumulated in the trap pipe. Particularly, since powder is concentrated and accumulated only in an entry of the trap pipe, a cleaning period of the trap pipe is short.

DISCLOSURE

Technical Problem

The present invention provides a byproduct collecting apparatus capable of swiftly collecting reaction-byproducts.

The present invention also provides a byproduct collecting apparatus having a long replacement period.

Technical Solution

Embodiments of the present invention provide byproduct collecting apparatuses including: a housing having a gas inlet port and a gas outlet port; and a trap module installed inside the housing and having first plates curved or inclined to guide an exhaust gas flow in one of curved and inclined fashions.

In some embodiments, the first plates of the trap module are arranged radially.

In other embodiments, the trap module further comprises a plurality of second plates installed inside the housing and formed to guide the exhaust gas flow in zigzags.

In still other embodiments, the trap module further comprises: a first trap part in which the first plates are installed; and a second trap part in which second plates are installed, the second plates arranged in a multi-step, spaced apart with a predetermined interval, and having a plurality of openings provided as a passage through which an exhaust gas flows.

In even other embodiments, the second trap part is provided to a position adjacent to the gas outlet port compared to the first trap part.

In yet other embodiments, the first plate has an outer side surface contacting an inner surface of the housing, and a cut portion is formed in the outer side surface of the first plate to allow an exhaust gas to flow between the inner surface of the housing and the outer side surface of the first plate.

In further embodiments, a plurality of through holes are formed in the first plate, and sizes of the through holes reduce as the through holes become more distant from the gas inlet port.

In still further embodiments, the trap module further comprises: an inner tube having an inner passage through which an exhaust gas flows, and an outer periphery on which the first plates and the second plates are fixed; and a third trap part installed in the inner passage of the inner tube to collect reaction-byproducts of an exhaust gas flowing through the inner passage.

In even further embodiments, the third trap part comprises a support rod located vertically at a center of the inner passage of the inner tube; and third plates installed slantly in the support rod; and fourth plates installed horizontally in the support rod.

In yet further embodiments, the byproduct collecting apparatus further comprises a blocking member for preventing a lump of powder detached from the tramp module from exhausting through the gas outlet port.

In some embodiments, the blocking member comprises a blocking threshold protruding in a direction facing an inside of the housing from one side of the housing provided with the gas outlet port, and a blocking plate located above the gas outlet port.

In other embodiments, the housing further comprises a cylindrical body whose upper and lower portions are open; an upper plate coupled to the upper portion of the body and having the gas inlet port; and a lower plate coupled to the lower portion of the body and having the gas outlet port. In still other embodiments, the byproduct collecting apparatus further comprises a cooling member having a first cooling part for cooling down the housing; and a second cooling part for cooling down the inner tube of the trap module.

In even other embodiments, the first cooling part comprises first cooling lines provided on a wall of the housing, and the second cooling part comprises second cooling lines provided on a wall of the inner tube. In yet other embodiments, the byproduct collecting apparatus further comprises a heating member for heating an exhaust gas introduced into the housing.

In other embodiments of the present invention, byproduct collecting apparatuses comprise: a housing having a gas inlet port and a gas outlet port; a first trap part provided inside the housing and on which first plates to collect reaction-byproducts; a second trap part provided inside the housing and on which second plates to collect reaction-byproducts, wherein the first plates and the second plates are shaped to guide an exhaust gas flow in different directions.

In some embodiments, each of the first plates has an inclined shape to guide the exhaust gas flow in a curved fashion, each of the second plates is disposed perpendicularly to a longitudinal direction of the housing, the second plates are spaced apart with a predetermined interval to face each other, and openings are formed in the second plates such that a gas flows in zigzags.

In other embodiments, the first plate has such a shape as to allow an exhaust gas to get out of a vertical flow when the exhaust gas flows in the longitudinal direction of the housing.

In still other embodiments, the first plate has such a shape as to allow an exhaust gas to flow in a curved fashion when the exhaust gas flows in the longitudinal direction of the housing.

In even other embodiments, each of the first plates is installed to have a slope range of 50-60° to the longitudinal direction of the housing.

Advantageous Effects

The present invention has a particular effect of more swiftly cooling down reaction-byproducts using a double cooling line structure.

The present invention can improve collection efficiency of reaction-byproducts by cooling down the reaction-byproducts in an outer surface and an inner surface of a housing, simultaneously.

The present invention has an advantage of maximizing a collecting amount using a widened powder adsorption area by dividing an inner space of a housing into a outer annular space and a central space, and arranging plates having various shapes in each of the spaces.

According to the present invention, since powder is uniformly collected over a trap module on the whole, an operation period of a collecting apparatus can be extended, a productivity reduction problem caused by operation suspension due to frequent replacement can be solved.

The present invention can prevent a damage of a vacuum pump by preventing powder lumps falling from a collecting module from being discharged through an gas outlet port.

BEST MODE

Figure 1:
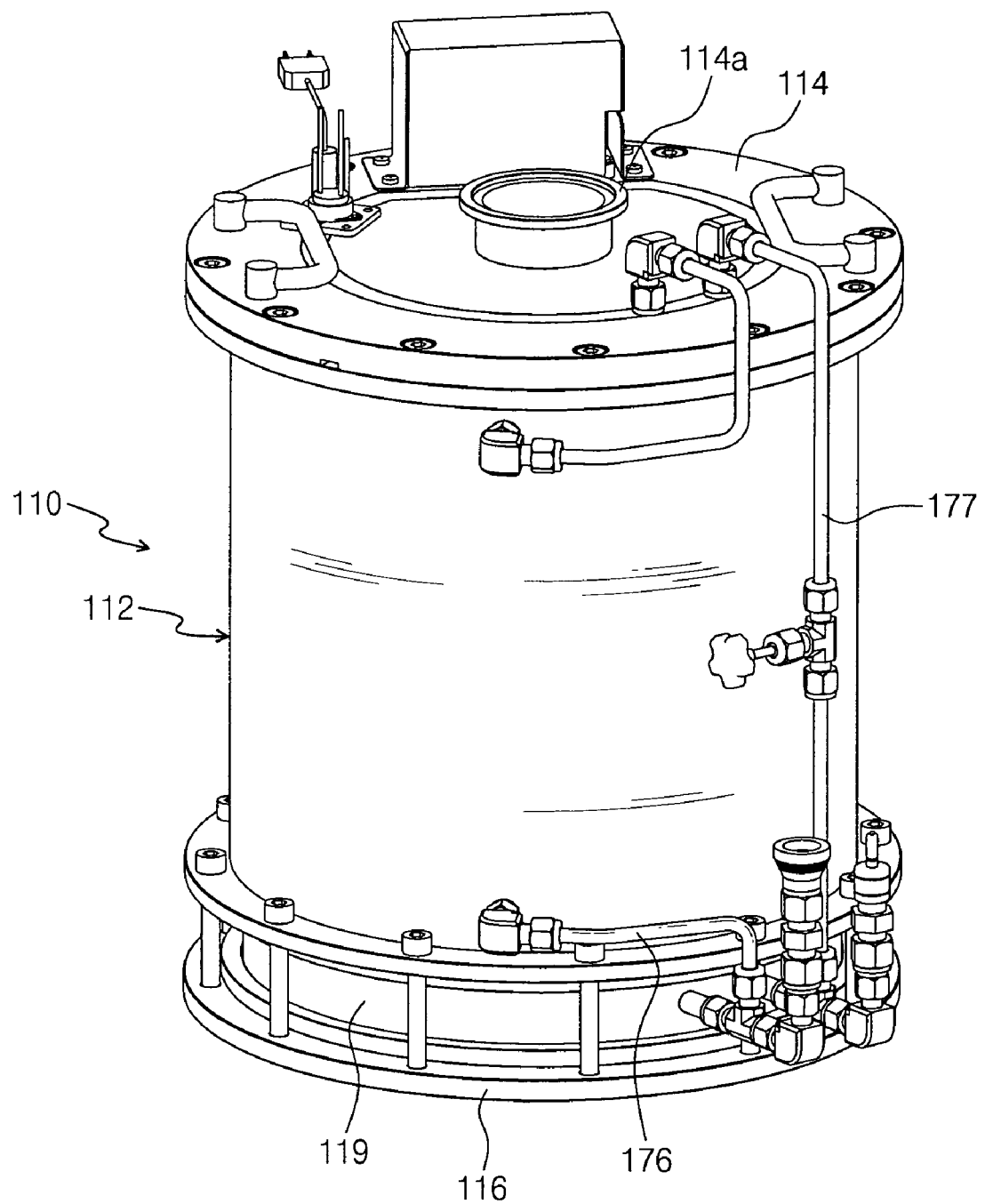
FIG. 1 is a view illustrating an appearance of a byproduct collecting apparatus according to an embodiment of the present invention.
Figure 2:
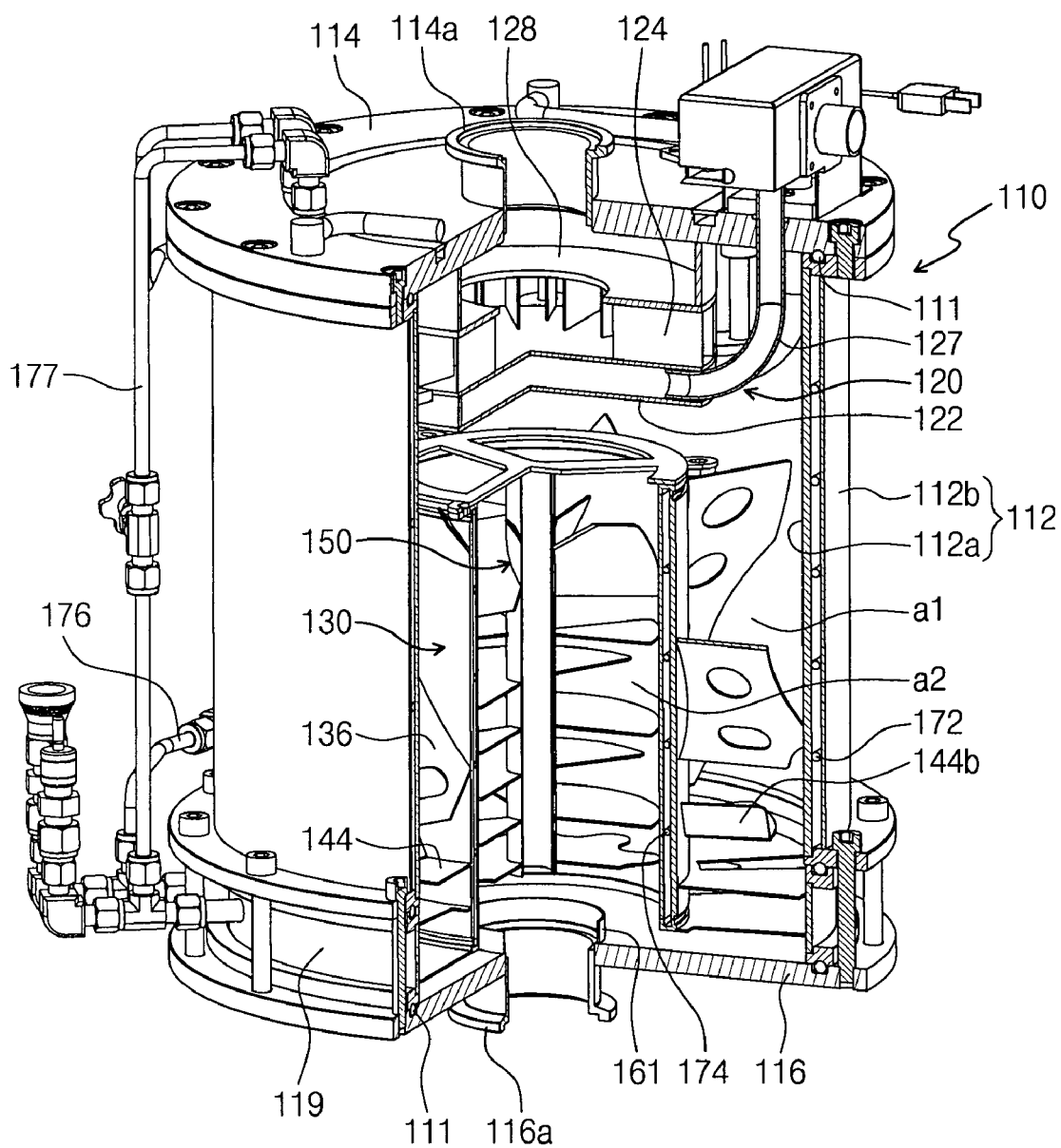
FIG. 2 is a partial sectional view of a byproduct collecting apparatus.
Figure 3:
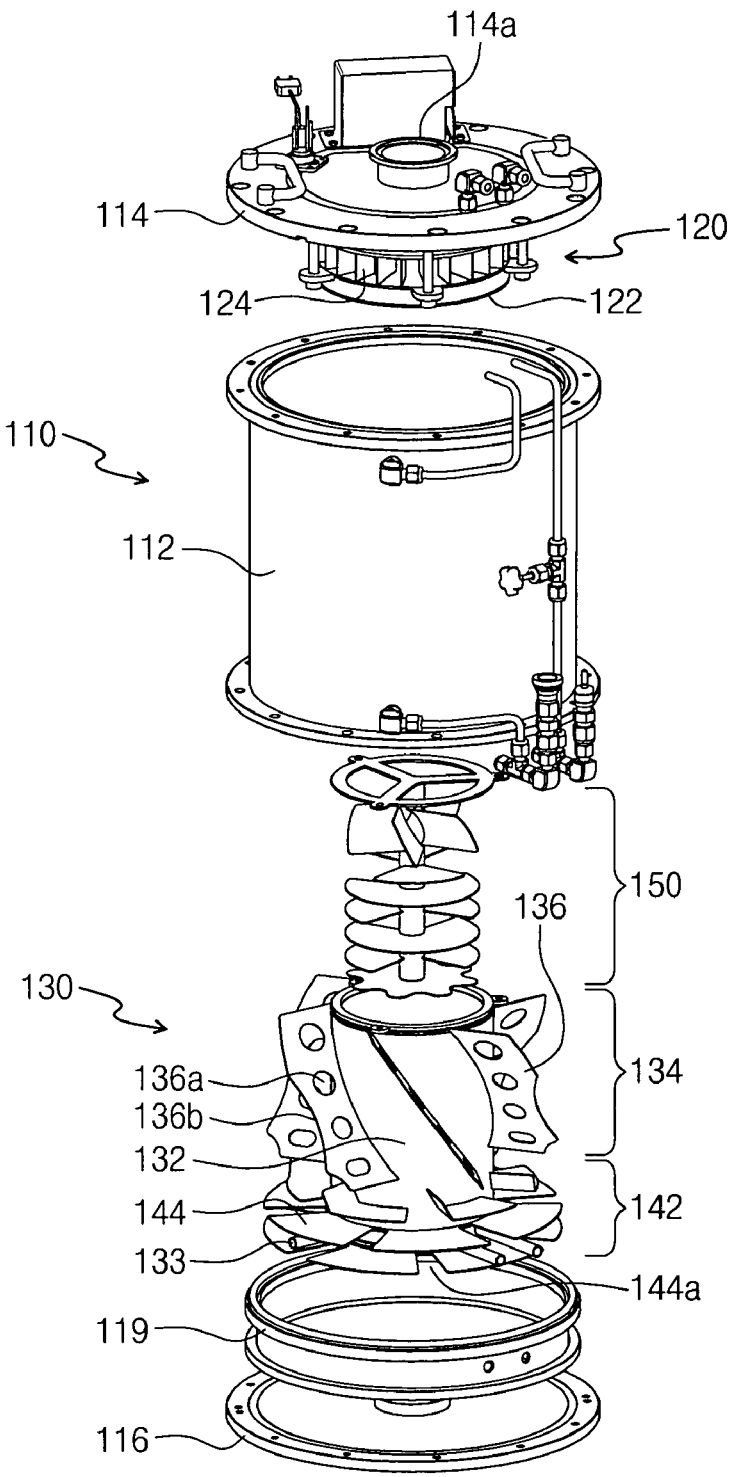
FIG. 3 is an exploded perspective view of a byproduct collecting apparatus.
Figure 4:
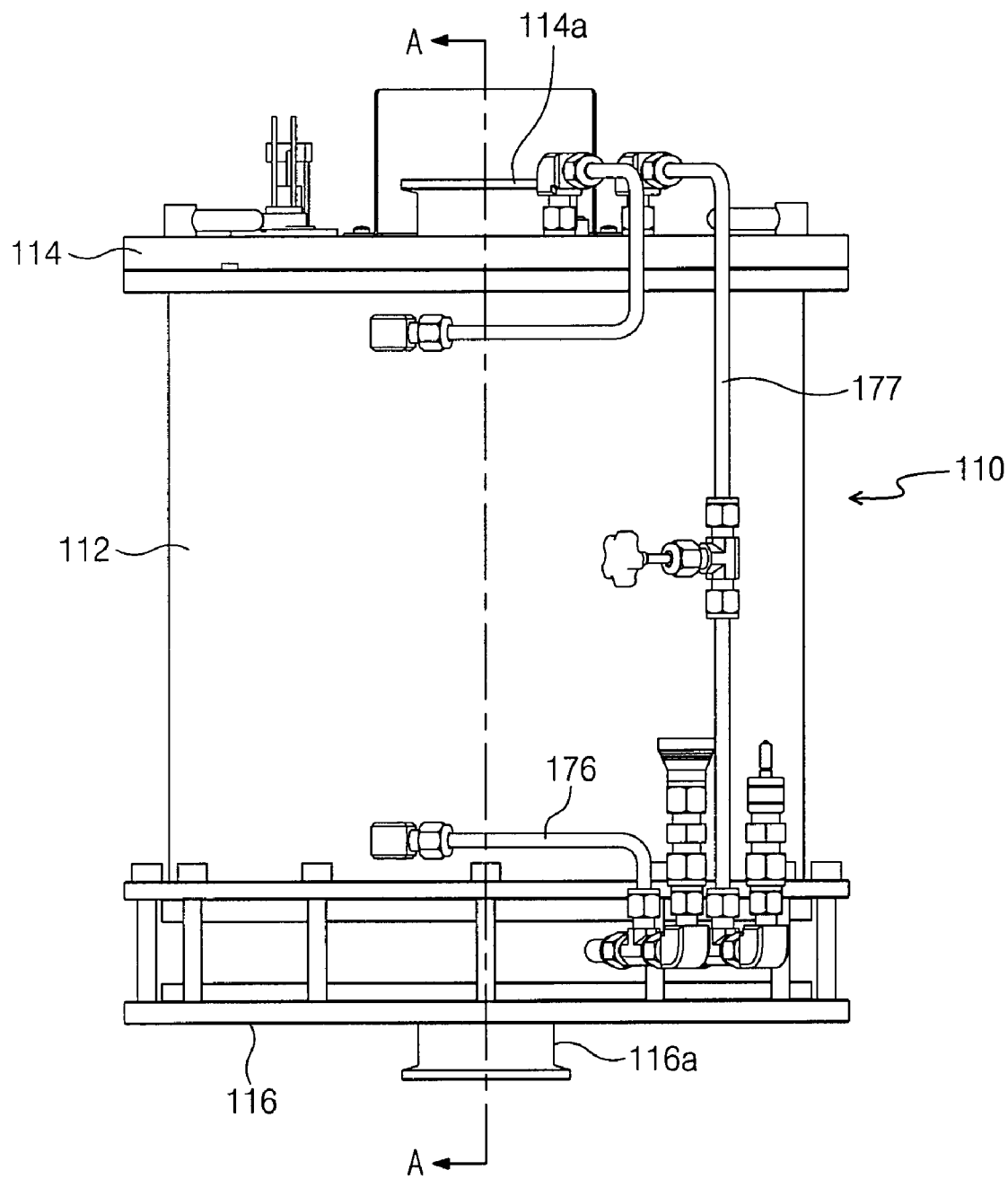
FIG. 4 is a side view illustrating a byproduct collecting apparatus.
Figure 5:
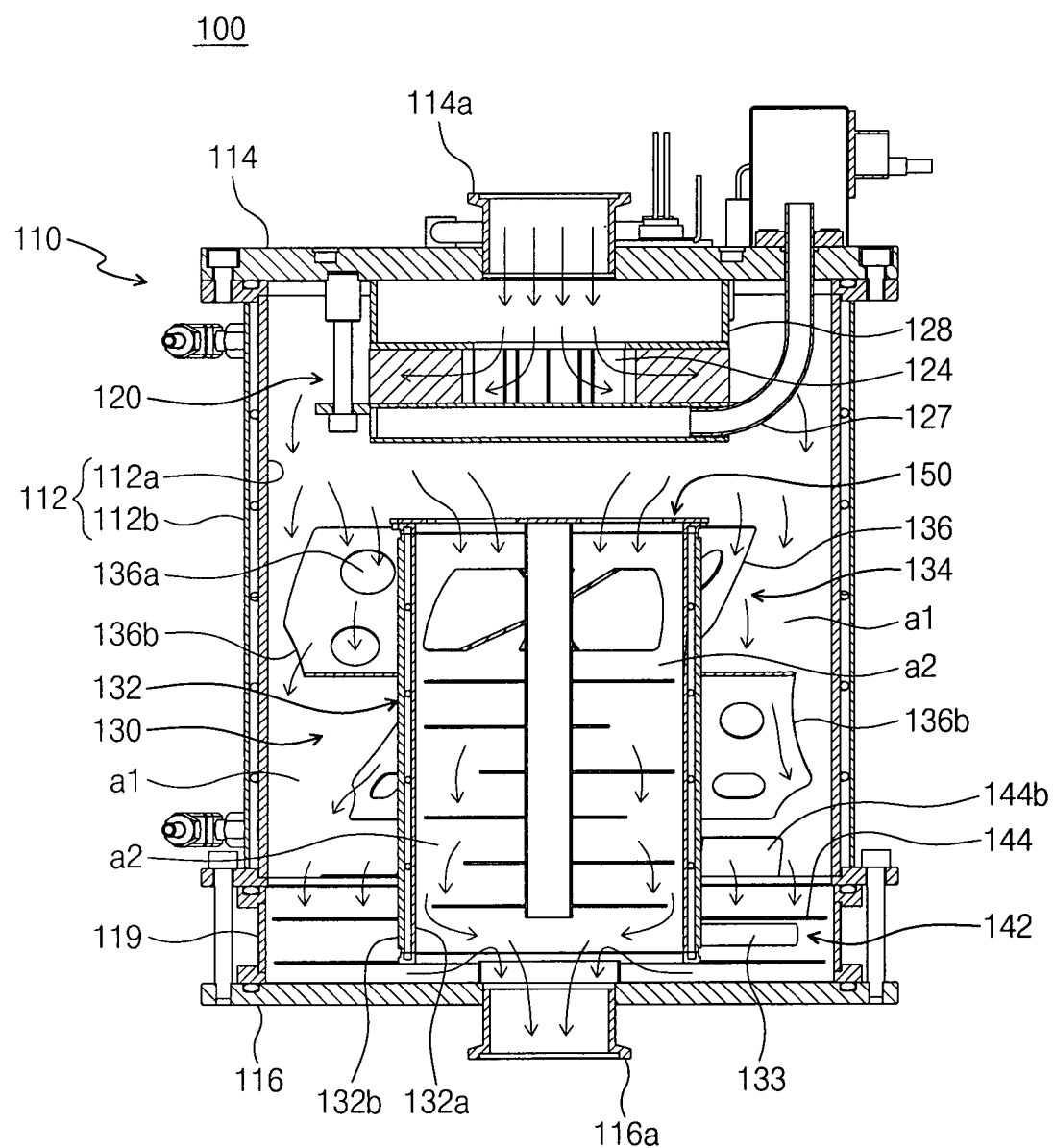
FIG. 5 is a cross-sectional view taken along the line a-a of FIG. 4.
Figure 6:
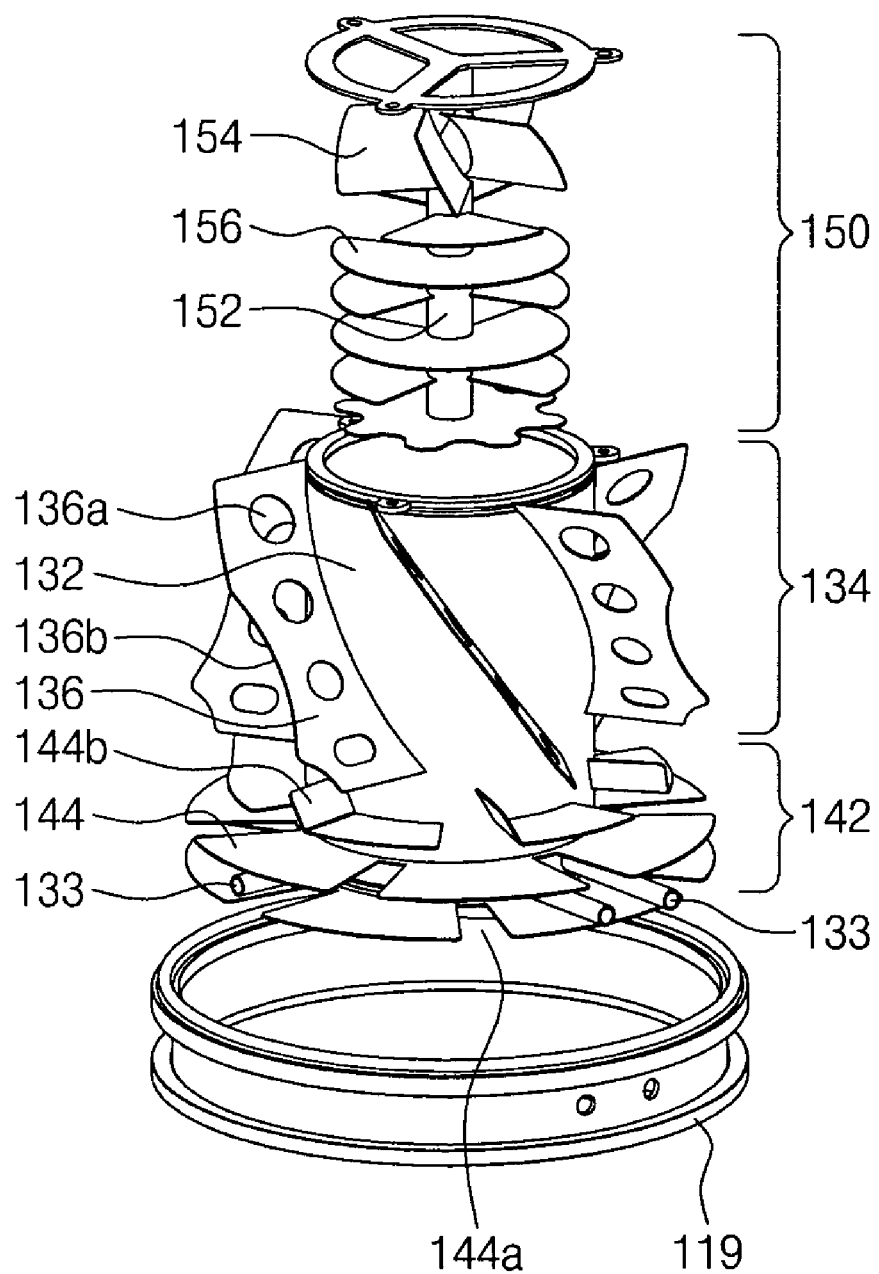
FIG. 6 is an exploded perspective view of a trap module.
Figure 7:
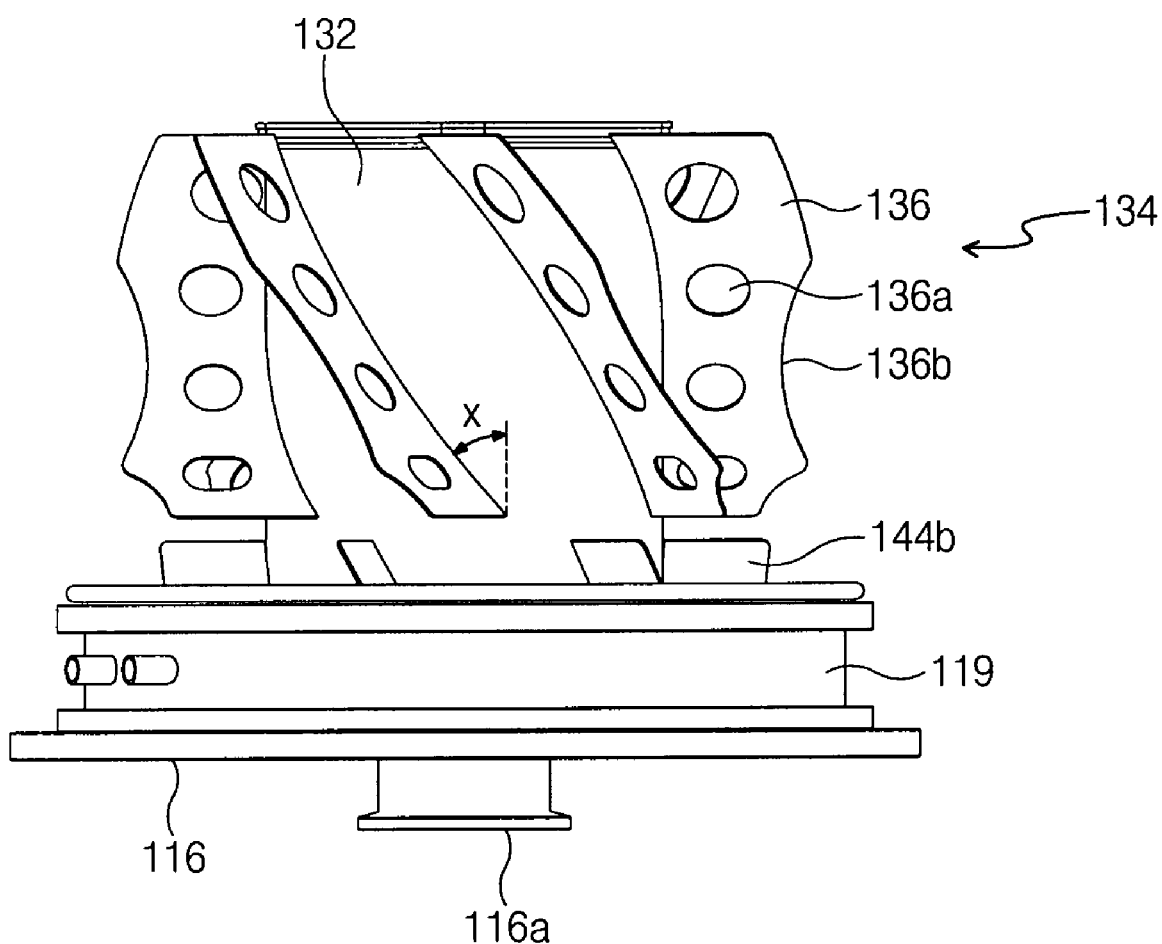
FIG. 7 is a side view of a trap module.

A collecting apparatus according to the present invention has a structure allowing an exhaust gas to pass through a simple wide path at a front part and pass through a complicated and narrow path at a rear part, thereby allowing powder to be uniformly accumulated on not only the front part but also the rear part. Also, the collecting apparatus according to the present invention has a structure capable of doubly cooling down the temperature of the exhaust gas in an outer side and an inner side of a housing in order to more swiftly cooling the temperature of the exhaust gas. FIG. 1 is a view illustrating an appearance of a byproduct collecting apparatus according to an embodiment of the present invention, FIG. 2 is a partial sectional view of a byproduct collecting apparatus, FIG. 3 is an exploded perspective view of a byproduct collecting apparatus, FIG. 4 is a side view illustrating a byproduct collecting apparatus, and FIG. 5 is a cross-sectional view taken along the line a-a of FIG. 4.

The byproduct collecting apparatus is installed a rear end of a pump on an exhaust line of a process chamber where reaction-byproducts are generated when a thin film is deposited or etched during a semiconductor or liquid crystal display device manufacturing process, or a similar process.

Referring to FIGS. 1 to 5, the byproduct collecting apparatus 100 includes a housing 110, a heating element 120, a trap module 130, and a cooling member 170.

The housing 110 includes a cylindrical body 112, an upper plate 114 coupled on an upper portion of the body 112 by bolting, and a lower plate 116 coupled on a lower portion of the body 112 by bolting.

The body 112 has a double wall structure including an inner wall 112a and an outer wall 112b. A first cooling line 172 through which coolant circulates is installed in a spiral shape between the inner wall 112a and the outer wall 112b. A surface temperature of the body 112 and an inner temperature of the housing are lowered by the first cooling line 172. The upper plate 114 has a gas inlet port 114a through which an exhaust gas is introduced, and the lower plate 116 has a gas outlet port 116a through which an exhaust gas is discharged. An exhaust line connected to a process chamber is connected to the gas inlet port 114a. An exhaust line connected to a vacuum pump is connected to the gas outlet port 116a. For reference, an O-ring, which is a sealing element for preventing leakage of an exhaust gas, may be installed in the housing 110.

As described above, since the housing 110 has a structure easy to separate and assemble, maintenance of the housing 110 is convenient. For example, maintenance of the housing 110 is performed to remove powder deposited on the inner wall of the housing 110 (inner wall of the body 112) and the trap module.

The heating element 120 is installed under the upper plate 114 of the housing 110. The heating element 120 includes a heater 122 and a plurality of heating plates 124 installed on an upper surface of the heater 122. The heating plates 124 are installed radially so that an exhaust gas introduced to the central portion can diffuse toward peripheral outer side, i.e., the inner wall 112a of the housing 110. An exhaust gas is uniformly diffused to peripheral portions where the inner wall of the housing 110 is located by the heating plates 124 installed radially on the heater 122. Simultaneously, the heating plates 124 provide a heating path until an exhaust gas reaches the upper center of the heater 122 and immediately diffuses to edges. Accordingly, the exhaust gas is sufficiently heated by the heat plates 124 to receive energy required for chemical change.

The heater 122 is connected to an external power source and has a hot wire therein. The heater 122 may be formed of a material such as ceramic and inconel. Also, a sheathing pipe 127 for inserting and drawing a hot wire from the outside of the housing 110 is connected to the heater 122. Meanwhile, the heater 120 includes a cylindrical guide 128 for guiding an exhaust gas flow so that an exhaust gas introduced into the housing 110 via the gas inlet port 114a flows to a central portion. The cylindrical guide 128 is installed on the heating plates 124. The heating plates 128 according to the present invention can be somewhat modified to guarantee the exhaust gas flow under vacuum pressure.

Referring to FIGS. 2, 5 to 7, the trap module 130 is a very crucial element in collecting powder. The trap module 130 includes a first trap part 134, a second trap part 142, a third trap part 150, and an inner tube 132.

The inner tube 132 is located at the center of the housing 110. The inner tube 132 is spaced apart with a predetermined distance from the lower plate of the housing 110 by a plurality of horizontal support pins 133. The horizontal support pins 133 are installed at a flange ring 119 of the housing 110. The first trap part 134 and the second trap part 142 are installed on the outer periphery of the inner tube 132. The third trap part 150 is installed inside the inner tube 132. The inner tube 132 is cooled down by a second cooling line 174. The second cooling line 174 is installed in a spiral shape between an outer wall 132b and an inner wall 132a of the inner tube 132.

That is, an inner space of the housing 110 is divided by the inner tube 132 into a outer annular space a1 corresponding to an outer side of the inner tube 132 and an inner central space a2 corresponding to an inner side (inner path) of the inner tube 132. A portion of an exhaust gas introduced to the inner space of the housing 110 flows to the outer annular space a1, and the rest of the exhaust gas flows to the inner central space a2. The first and second trap parts 134 and 142 are located in the outer annular space a1. The third trap part 150 is located in the inner central space a2. The temperature of the exhaust gas that flows to the outer annular space a1 falls down under an temperature influence of the housing 110 and the inner tube 132. The temperature of the exhaust gas that flows to the inner central space a2 (the inner passage of the inner tube) falls down under a temperature influence of the inner tube 132. Since an exhaust gas passing through the inner space of the housing 110 is uniformly cooled down according to the present invention as described above, the trap module 130 may change reaction-byproducts into powder and collect powder more efficiently.

As described above, the powder collecting apparatus 130 of the present invention is characterized in that it not only includes a structure having the housing 110 and the inner tube 132 located inside the housing 110, but also includes a multi-cooling structure in which both the housing 110 and the inner tube 132 are cooled down.

The first trap part 134 includes six first plates 136 installed radially (with an interval of 60°) and slantly on the outer periphery of the inner tube 132. The first plates 136 are curve-shaped in order to guide an exhaust gas flow in a curved fashion. The first plates 136 are spaced apart with a sufficient distance for swift flow of the exhaust gas. That is, the first plates with curved shape are installed slantly on the outer periphery of the inner tube. At this point, the first plates 136 may be installed with a slope of a predetermined angle of 50-60°. For example, when the slopes of the first plates 136 are large (that is, the first plates 136 are laid much), powder is concentrated on only the first plates 136. On the other hand, when the slopes of the first plates 136 are small (that is, the first plates 136 are erected much), powder is not accumulated on the first plates 136, but accumulated on only the second plates. Meanwhile, the first plates 136 include a plurality of through holes 136a. The through holes 136a may reduce in their sizes as the through holes 136a become more distant from the gas inlet port 114a. Since an outer side surface 137 of the first plate 136 contacts the inner side 112a of the housing 110 (i.e., the inner wall of the body), heat exchange with the housing 110 is easily performed. That is, the first plates 136 are cooled down by the inner tube 132 and the housing 110. The first plate 136 includes a cut portion 136b formed by cutting a portion of the first plate 136 along an outer side surface 137. For example, the first plate 136 may have a flat plate shape and be inclined by a predetermined angle on an outer periphery of the inner tube.

An exhaust gas flow on the first trap part 134 will be described below. An exhaust gas flows while it turns around along curved passages between the first plates 136. A portion of the exhaust gas flows downwardly through the through holes 136a and the cut portions 136b of the first plates 136. For swift flow of an exhaust gas, the first trap part 134 provides a plurality of auxiliary vertical paths besides a main inclined path. The second trap part 142 is located at a lower end of the first trap part 134. The second trap part 142 includes three-step second plates 144 for providing horizontal and vertical paths through which an exhaust gas can flow in zig-zags on an outer periphery of the inner tube 132. The horizontal paths are provided between the second plates 144, and the vertical paths are provided by a plurality of openings 144a formed in the second plates 144. The openings 144a of the second plates 144 are formed in different locations. The second plate 144 located at an uppermost end adjacent to the first trap part 134 has an inclined portion 144b inclined upward so that an exhaust gas that has passed between the first plates 136 of the first trap part 132 may be easily introduced to the second trap part 142. In the case where the inclined portion 144b is not present, a vortex is generated at a space between the first trap part 134 and the second trap part 142, and this vortex hinders a swift flow of powder, which causes concentration of the powder on only the upper end of the second trap part 142.

As is revealed from the drawings, the length of the first trap part 134 is longer than that of the second trap part 142. For example, a length ratio of the first trap part 134 to the second trap part 142 may be 7:3. For example, when a length ratio of the first trap part to the second trap part is controlled to 5:5, there occurs a phenomenon that reaction-byproducts are concentrated on the first trap part. This phenomenon may be generated due to accumulation of byproducts at the first trap part. The accumulation of the byproducts may be caused by slope angles of the first plates of the first trap part and a long movement path of the second trap part.

The third trap part 150 is installed in the inner path a2 of the inner tube 132. The third trap part 150 is designed for collecting reaction-byproducts of the exhaust gas that flows through the inner path a2 of the inner tube 132. The third trap part 150 includes a support rod 152 vertically located at the center of the inner path a2 of the inner tube 132, four third plates 154 installed to be inclined at the support rod 152, and fourth plates 156 horizontally installed at the support rod 152. An upper portion of the support rod 152 is coupled to the inner tube 132 using three bolts. The fourth plates 154 are installed at the support rod in six-step. The fourth plate 154 installed at a lowermost end is formed in a circular shape so that a lump of powder does not fall down to the gas outlet port 116a, and has an outer surface formed in a curved shape to allow an exhaust gas to be easily discharged.

FIGS. 8 to 11 are views illustrating various modifications of the third trap part.

Figure 8:
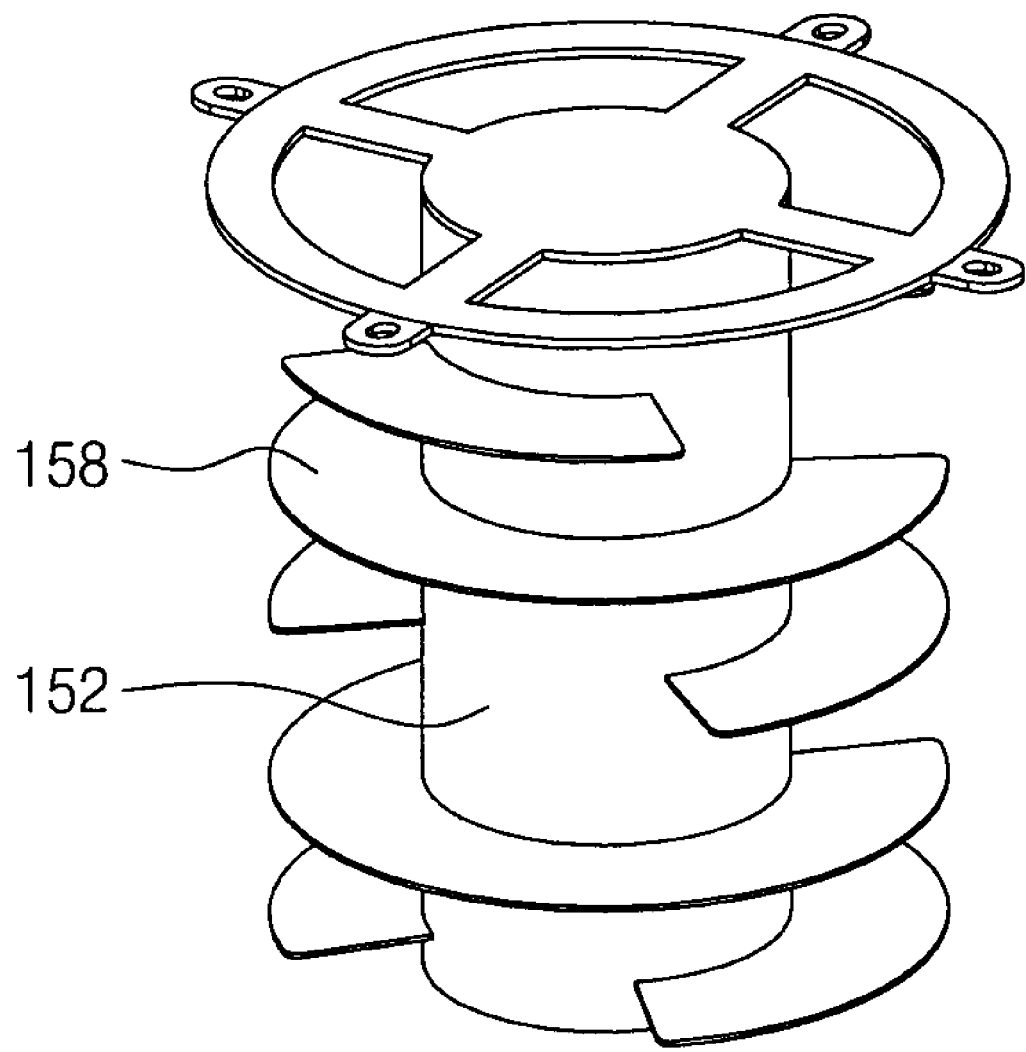
FIG. 8 is a perspective view of a modified third trap part.
Figure 9:
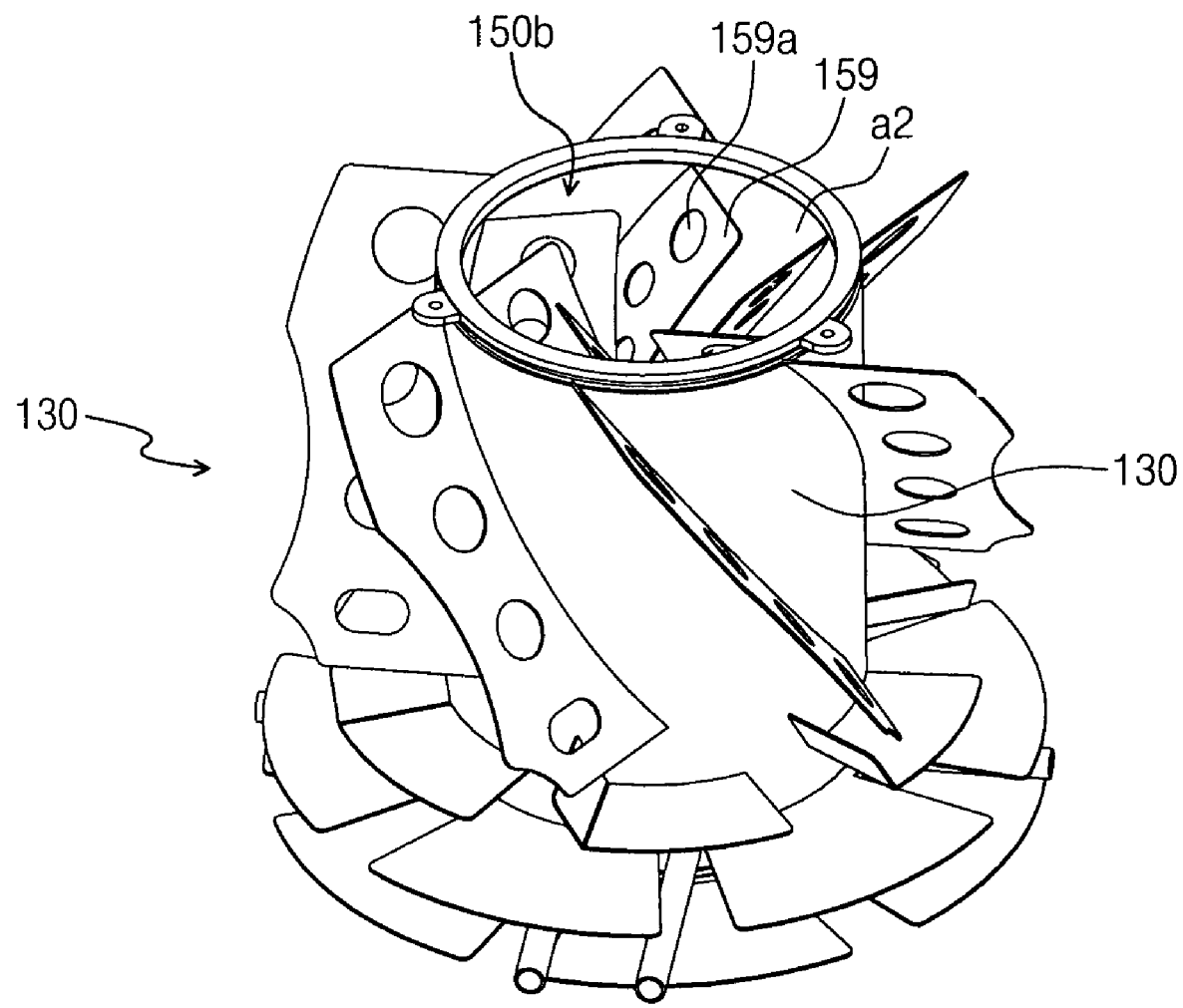
FIG. 9 is a perspective view of a trap module having a modified third trap part.
Figure 10:
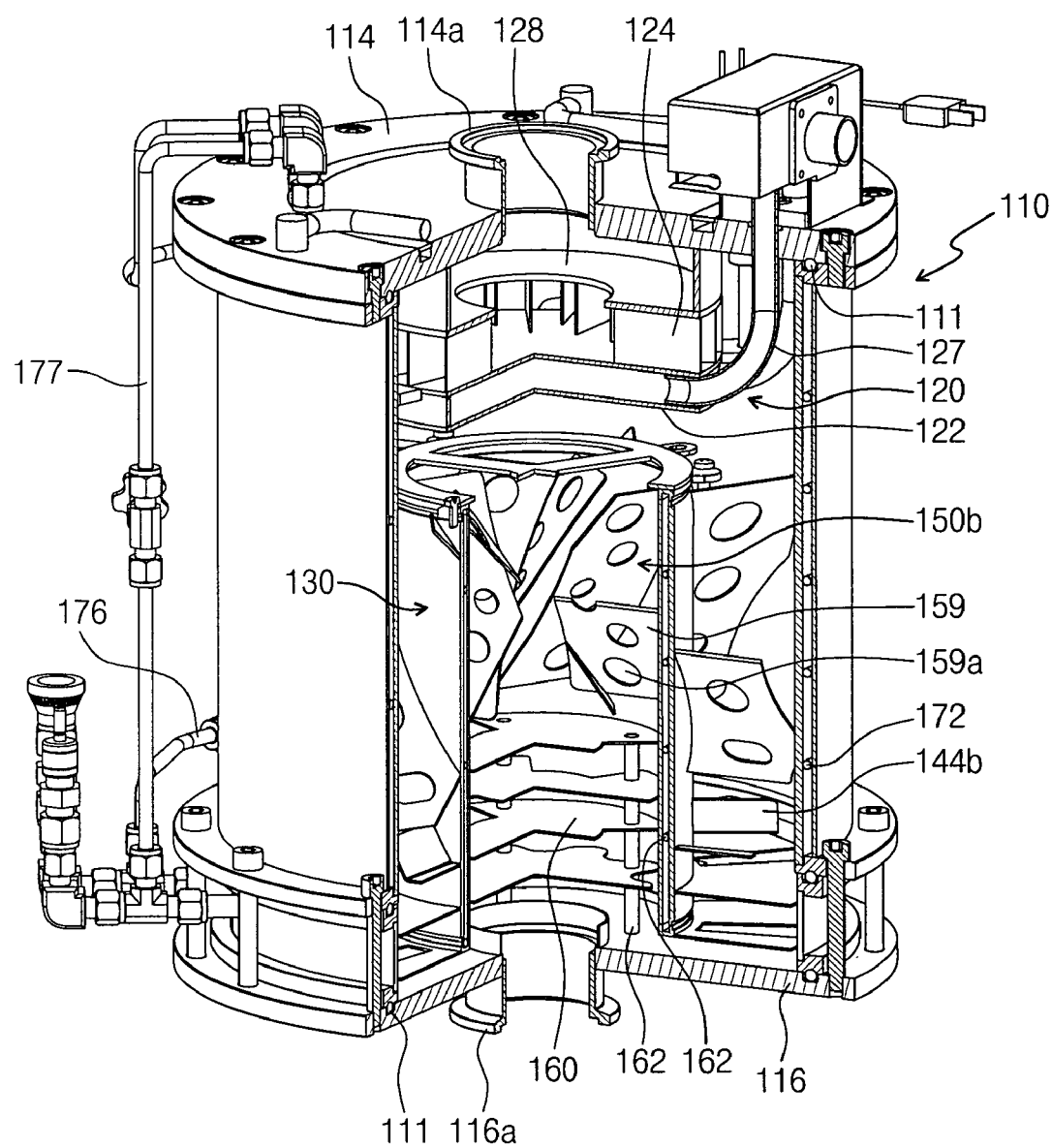
FIG. 10 is a partial sectional view of a byproduct collecting apparatus in which the trap module of FIG. 9 has been installed.
Figure 11:
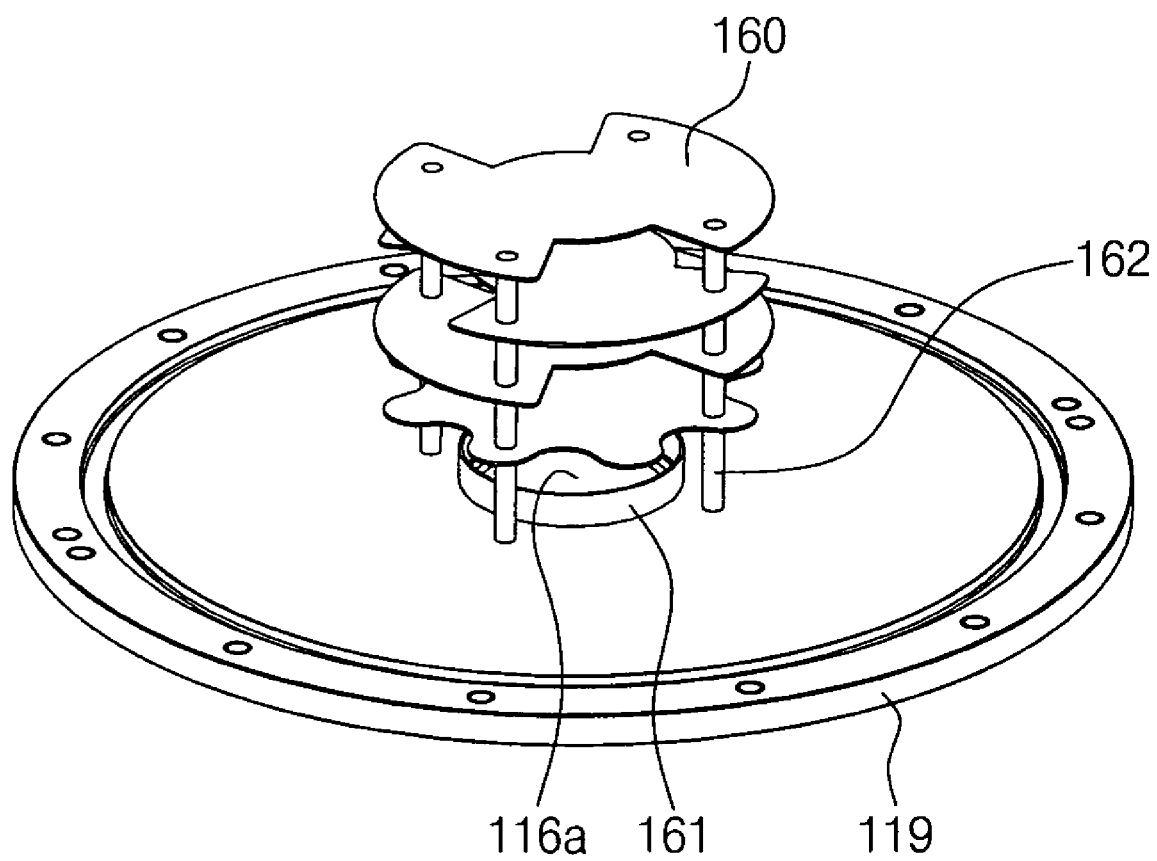
FIG. 11 is a view illustrating sixth plates of the third trap part of FIG. 10.

FIG. 8 illustrates a third trap part 150a including a support rod 152 and fourth plates 158 installed at the support rod 152 in a multi-step. Also, FIGS. 9 to 11 illustrate a third trap part 150a including six fifth plates 159 having through holes 159a and horizontal sixth plates 160. The fifth plates 159 are positioned to be inclined with respect to an inner path a2 of an inner tube 132 and installed such that inner sides of the fifth plates contact an inner surface 132a of the inner tube 132. Also, the sixth plates 160 are installed in a multi-step with being supported from the upper surface of a lower plate 116 by three support rods 161. Meanwhile, the byproduct collecting apparatus according to the present invention includes a blocking member. The blocking member blocks powder so that a lump of powder detached from a trap module 130 does not get out through an gas outlet port 116a. The blocking member includes a blocking threshold 162 protruding upward from the inner surface of the lower plate 116. The blocking threshold is designed for blocking a lump of powder introduced from side directions. For example, the blocking member can be installed at the third trap part 130. The fourth plate 154 located at a lowermost end of the third trap part 150 illustrated in FIG. 6, and the sixth plate located at a lowermost end of the third trap part 150b illustrated in FIG. 10 serve as blocking plates.

Though there is no limitation in the number of plates installed in the trap module 130, a swift flow of an exhaust gas is hindered when too many plates are installed. Also, in the case where an interval between the plates is too narrow, a path is rapidly blocked when powder is deposited. Therefore, the number of the plates installed can be appropriately selected with general consideration of various factors such as an installation environment, an inner pressure of the housing, and a process to be performed on the whole.

As described above, the byproduct collecting apparatus according to the present invention is characterized in that powder is uniformly deposited not only at a front portion but also at a rear portion by allowing an exhaust gas to pass through simple wide movement paths at the front portion and to pass through complicated narrow movement paths at the rear portion. In other words, reaction-byproducts of an exhaust gas introduced into the housing 110 are changed into powder by a low temperature atmosphere of the housing 110. At this point, a portion of the powder changed from the exhaust gas is accumulated on the outer surface of the first plates 136 of the first trap part 134 and the inner tube 132 while the exhaust gas passes through the inclined wide movement paths of the first trap part 134. Also, the rest of the powder of the exhaust gas that has passed through the first trap part 134 is accumulated on the surfaces of the second plates 144 and the outer periphery of the inner tube 132 while the exhaust gas passes through the complicated narrow paths provided by the second plates 144 of the second trap part 142.

The cooling member 170 is designed for making the inside of the housing 110 a low temperature atmosphere in order to trap reaction-byproduct contained in an exhaust gas introduced into the housing 110. Referring to the drawing, the cooling member 170 includes a first cooling line 172 for cooling down a body 112 of the housing 110, a second cooling line 174 for cooling down the inner tube 132 of the trap module 130, a supply pipe 176 for supplying coolant to the first and second cooling lines 172 and 174, and a discharge pipe 177 for discharging coolant that has passed through the cooling lines.

Here, the first and second cooling lines 172 and 174 not only cool down the surfaces of the housing 110 and the inner tube 132, but also lower the inner temperature of the housing 110 and the temperature of the plates of the trap module 130. When coolant is introduced to the first and second cooling lines 172 and 174, inner temperatures of the housing 110, inner tube 132, and plates 136, 144, 154, and 156 considerably and relatively reduce compared to the temperature of an exhaust gas.

Therefore, an exhaust gas (particularly, reaction-byproducts) is introduced to the housing 110 and heated by the heating member 120. When the exhaust gas in its vapor state immediately contacts the surfaces of the housing 110, inner tube 132, and plates 136, 144, 154, and 156 cooled down to a low temperature, the exhaust gas instantly changes into a layer and is deposited, so that rapid collection of the exhaust gas is performed. Here, reaction-byproducts generated at the moment the exhaust gas is deposited on the surface of the trap module 130 change into a layer and is deposited more rapidly, uniformly, and solidly on the surfaces of the plates 136, 144, 154, and 156, and inner tube 132 at a point when the reaction-byproducts change from a vapor state to a solid state.

Particularly, the housing 110 and the inner tube 132 are cooled down by the first and second cooling lines 172 and 174 to rapidly cool down the inner temperature of the housing 110 and the/surface temperature of the plates 136, 144, 154, and 156. The first and second plates 136 and 144 are installed to contact the inner wall of the housing 110 and the outer wall of the inner tube 132, and the third and fourth plates 154 and 156 are installed to contact the inner wall of the inner tube 132 to increase a heat exchange area of the plates 136, 144, 154, and 156. Therefore, an atmosphere under which reaction-byproducts introduced to the housing 110 can solidify more rapidly is formed.

As described above, the byproduct collecting apparatus according to the present invention has a structure that can cool down reaction-byproducts doubly in the outside and inside of the housing in order to more rapidly solidify the reaction-byproducts introduced to the housing.

An operation of the byproduct collecting apparatus in a semiconductor apparatus having the above-described construction will be described below with reference to the accompanying drawings.

First, coolant is supplied to the first cooling line 410 and the second cooling line 420 via a coolant supply pipe 40 connected to an external coolant tank. The surface temperatures of the housing, inner tube, and plates, and the inner temperature of the housing fall down while coolant flows through the first and second cooling lines. Also, as the heater 220 of the heating element operates to emit high temperature heat, the heating plates 210 contacting the heater 220 are heated to high temperature. While the byproduct collecting apparatus operates, an exhaust gas containing a large amount of reaction-byproducts generated from the process chamber connected to the collecting apparatus is introduced into the housing via the gas inlet port. The exhaust gas is heated by the heating element and diffused to the inner space of the housing 110.

A portion of the exhaust gas that has diffused to the inner space of the housing 110 flows to the outer annular space a1, and the rest of the exhaust gas flows to the central space a2. The portion of the exhaust gas that flows to the outer annular space a1 contacts the inner wall of the housing 110, and outer wall surfaces of the first plates and inner tube that have been already cooled down to low temperature. The portion of the exhaust gas is cooled down at the moment when it contacts the inner wall of the housing 110, and outer wall surfaces of the first plates and inner tube, and deposited on each surface while it rapidly solidifies from its vapor state.

Also, the portion of the exhaust gas that flows to the central space (inner path a2 of the inner tube) contacts the inner wall of the inner tube and the surfaces of the third plates that have been already cooled down to low temperature. The portion of the exhaust gas that flows to the central space is cooled down at the moment when it contacts the inner wall of the inner tube and the surfaces of the third plates, and deposited on each surface while it rapidly solidifies from its vapor state.

Since the present invention has a structure of performing a cooling operation doubly in the outside and inside of the housing as described above, the inner temperature of the housing can be maintained low and thus reaction-byproducts can solidifies more rapidly. For reference, reaction-byproducts in a gas state change into powder having strong adsorption characteristic when temperature rapidly falls down. Particularly, reaction-byproducts have a stronger adsorption characteristic at a portion cooled down to a predetermined temperature or less. Therefore, reaction-byproducts that pass through the inner space of the housing 110 are rapidly cooled down, so that the trap module 130 may change reaction-byproducts into powder and collect powder more efficiently.

Figure 12:
FIG. 12 is a photo illustrating reaction-byproducts have been collected to a trap module of the present invention.
Figure 13:
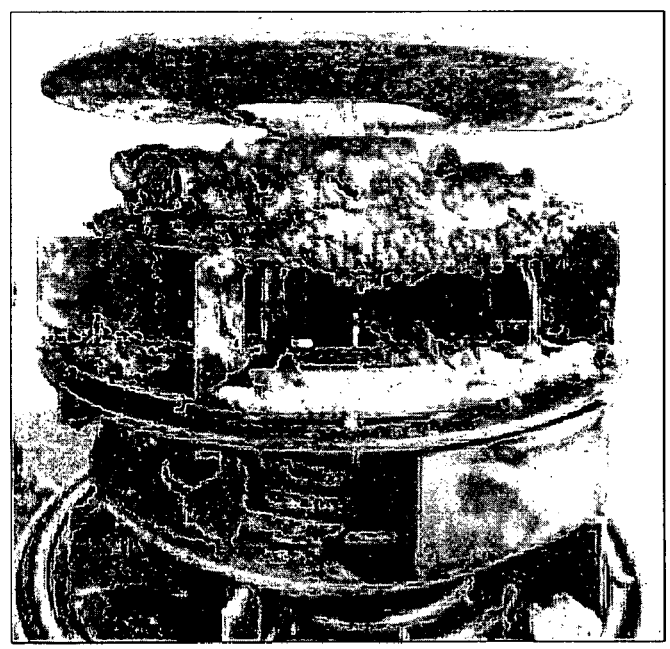
FIG. 13 is a photo illustrating reaction-byproducts have been collected at a trap module where plates are disposed in a multi-step.
Figure 14:
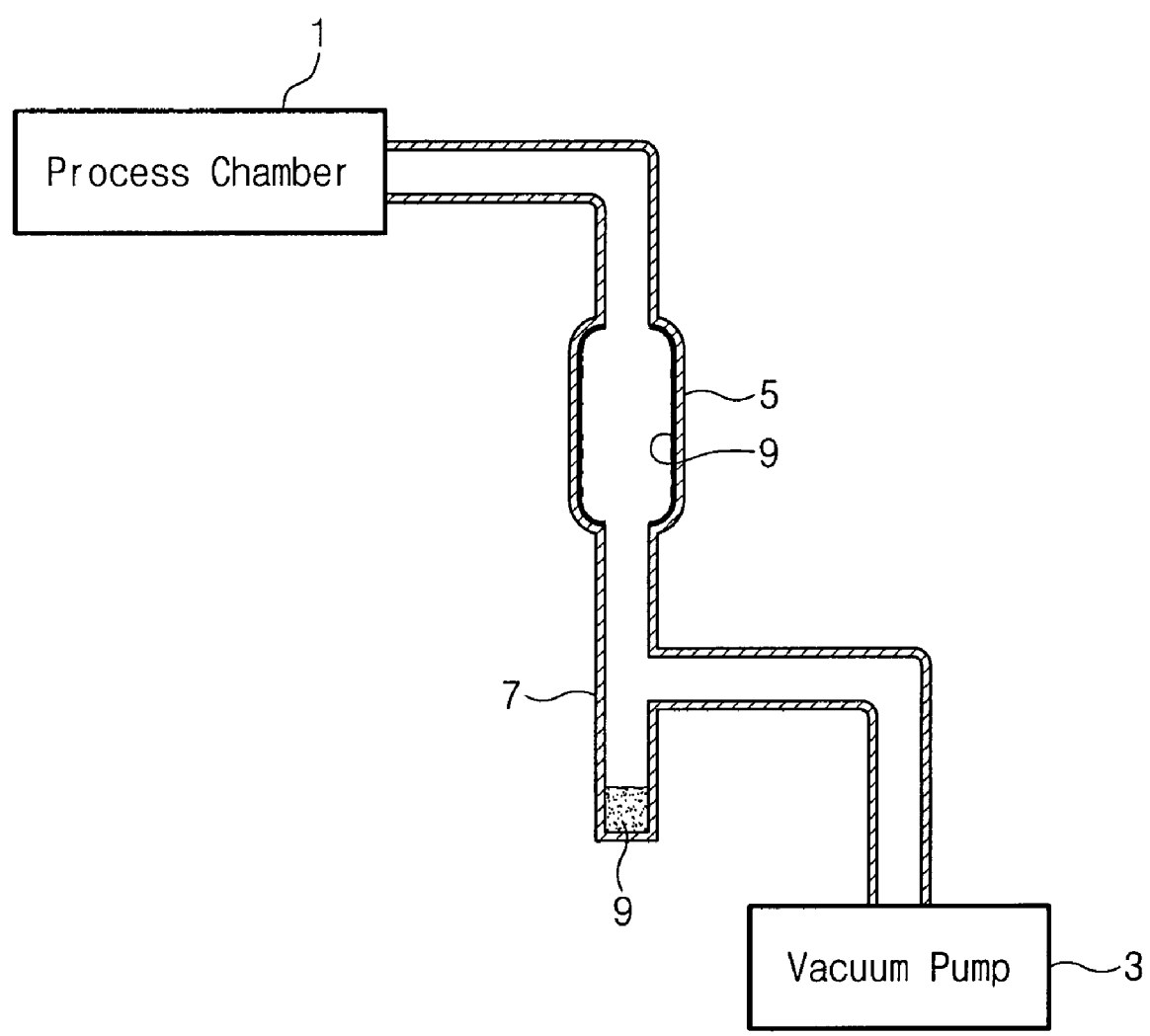
FIG. 14 is a conceptual view explaining a byproduct collecting apparatus according to prior art.

Meanwhile, other reaction-byproducts that have not been collected by the first trap part of the trap module are cooled down to a predetermined temperature or less, solidifies and are accumulated on the surfaces of the second plates, outer wall of the inner tube, and inner wall of the housing while they pass through horizontal and vertical paths of the second trap part in zigzags. Also, other reaction-byproducts that have not been collected at the upper end of the third trap part solidifies and are accumulated on the surfaces of the fourth plates and the inner wall of the inner tube while they pass through the fourth plates of the third trap part in zigzags. Accordingly, powder is uniformly deposited on the trap module on the whole as illustrated in FIG. 12. Referring to FIG. 13, since power is accumulated on only the upper surfaces of the upper plates on an upper portion in a trap module where disk-shaped plates are installed in a multi-step, not only a replacement period is very short, but also collecting efficiency remarkably reduces.

That is, the byproduct collecting apparatus according to the present invention has a structure allowing an exhaust gas to pass through a simple wide path at a front part and pass through a complicated and narrow path at a rear part, thereby allowing powder to be uniformly accumulated on not only the front part but also the rear part. Therefore, a replacement period of the collecting apparatus is remarkably extended, and thus a process delay reduces, productivity improves, and manufacturing costs reduce.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

The present invention can be applied to all of equipments manufacturing semiconductor and an LCD. Particularly, a byproduct collecting apparatus according to the present invention is applied on an exhaust line of a process chamber where reaction-byproducts are generated when a thin film is deposited or etched during a semiconductor, LCD manufacturing process, or other similar processes to efficiently collect reaction-byproducts exhausted onto the exhaust line.

What is claimed is:

1. An apparatus for collecting reaction-byproducts contained in an exhaust gas generated at a process chamber, the apparatus comprising:
   a housing having a gas inlet port and a gas outlet port; and
   a trap module installed inside the housing and having first plates curved or inclined for guiding exhaust gas flow in a curved fashion, the trap module comprising:
   a first trap part in which the first plates are installed; and
   a second trap part in which second plates are installed, the second trap part disposed below the first trap part and the second plates disposed in a multi-step arrangement and spaced apart at predetermined intervals, the second plates having a plurality of openings provided as a passage for flowing exhaust gas.

2. The apparatus of claim 1, wherein the first plates of the trap module are arranged radially and slantly.

3. The apparatus of claim 2, wherein the second plates are installed inside the housing and shaped for guiding the exhaust gas flow in zigzags.

4. The apparatus of claim 1, wherein a length of the first trap part is longer than that of the second trap part.

5. The apparatus of claim 1, wherein the second trap part is provided to a position adjacent to the gas outlet port compared to the first trap part.

6. The apparatus of claim 1, wherein the first plate has an outer side surface contacting an inner surface of the housing, and a cut portion is formed in the outer side surface of the first plate to allow the exhaust gas to flow between the inner surface of the housing and the outer side surface of the first plate.

7. The apparatus of claim 1, wherein a plurality of through holes are formed in the first plate.

8. The apparatus of claim 7, wherein sizes of the through holes reduce as the through holes become more distant from the gas inlet port.

9. The apparatus of claim 1, wherein the trap module further comprises: an inner tube having an inner passage through which an exhaust gas flows, wherein the first plates and the second plates are fixed on an outer periphery of the inner tube, and a third trap part installed in the inner passage of the inner tube to collect reaction-byproducts of the exhaust gas flowing through the inner passage.

10. The apparatus of claim 9, wherein the third trap part comprises: a support rod located vertically at a center of the inner passage of the inner tube; third plates installed slantly in the support rod; and fourth plates installed horizontally in the support rod.

11. The apparatus of claim 9, further comprising a blocking member for preventing a lump of powder falling from the trap module from exhausting through the gas outlet port.

12. The apparatus of claim 11, wherein the blocking member comprises a blocking threshold protruding in a direction facing an inside of the housing from one side of the housing provided with the gas outlet port.

13. The apparatus of claim 12, wherein the blocking member further comprises a blocking plate located above the gas outlet port.

14. The apparatus of claim 1, wherein the housing comprises: a cylindrical body whose upper and lower portions are open; an upper plate coupled to the upper portion of the body and having the gas inlet part; and a lower plate coupled to the lower portion of the body and having the gas outlet port.

15. The apparatus of claim 9, further comprising a cooling member for cooling down an exhaust gas flowing through the housing.

16. The apparatus of claim 15, wherein the cooling member comprises:
a first cooling part for cooling down the housing; and a second cooling part for cooling down the inner tube of the trap module, wherein the first plates and the second plates exchange heat with the housing and the inner tube cooled down by the cooling member.

17. The apparatus of claim 16, wherein the first cooling part comprises first cooling lines provided on a wall of the housing, and the second cooling part comprises second cooling lines provided on a wall of the inner tube.

18. The apparatus of claim 1, further comprising a heating element for heating an exhaust gas introduced into the housing.

19. An apparatus for collecting reaction-byproducts contained in an exhaust gas generated at a process chamber, the apparatus comprising:
a housing having a gas inlet port and a gas outlet port;
a first trap part provided inside the housing, wherein first plates for collecting reaction-byproducts are installed on the first trap part; and
a second trap part disposed below the first trap part and provided inside the housing, wherein second plates for collecting reaction-byproducts are installed on the second trap part, wherein the first plates and the second plates are shaped to guide an exhaust gas flow in different directions; and
wherein each of the first plates has an inclined shape for guiding the exhaust gas flow in a curved fashion, and each of the second plates is disposed perpendicularly to a longitudinal direction of the housing, the second plates are spaced apart with a predetermined interval to face each other, and openings are formed in the second plates such that a gas flows in zigzags.

20. The apparatus of claim 19, wherein each of the first plates is installed to have a slope range of 50-60° to the longitudinal direction of the housing.

21. The apparatus of claim 19, wherein the first plate has such a shape as to allow an exhaust gas to get out of a vertical flow when the exhaust gas flows in the longitudinal direction of the housing.

22. The apparatus of claim 19, wherein the first plate has such a shape as to allow an exhaust gas to flow in a curved fashion when the exhaust gas flows in the longitudinal direction of the housing.

23. An apparatus for collecting reaction-byproducts contained in an exhaust gas generated at a process chamber, the apparatus comprising:
a housing having a gas inlet port; a gas outlet port, and an inner passage through which the exhaust gas flows;
a cooling tower installed inside the housing, the cooling tower comprising a tube shape to divide the inner passage into an outer annular space and an inner central space; and
a trap module provided inside the housing and having a plurality of plates to collect reaction-byproducts on surfaces of the plates;
wherein the plurality of plates comprises third plates installed in the central space of the cooling tower to collect reaction-byproducts of an exhaust gas that flows through the central space.

24. The apparatus of claim 23, further comprising a cooling member for cooling down the housing and the cooling tower.

25. The apparatus of claim 24, wherein the plurality of plates abut on an inner surface of the housing and an outer surface of the cooling tower.

26. The apparatus of claim 24, wherein the plurality of plates further comprises first plates and second plates shaped to guide an exhaust gas flow in different directions.

27. The apparatus of claim 26, wherein the trap module comprises: a first trap part in which the first plates are installed; and a second trap part in which the second plates are installed, wherein the first plates are curved or planar to guide the exhaust gas flow in a curve fashion, and the second plates has a shape to guide the exhaust gas flow in zigzags.

28. The apparatus of claim 27, wherein the first plates are arranged radially and slantly.

29. The apparatus of claim 24, further comprising a blocking member for preventing a lump of powder that falling from the trap module from exhausting through the gas outlet port.

30. The apparatus of claim 24, wherein the cooling member comprises: a first cooling part having first cooling lines provided on a wall of the housing; and a second cooling part having second cooling lines provided on a wall of the cooling tower, wherein the plates exchange heat with the housing and the cooling tower cooled down by the cooling member.

* * * * *